(12) United States Patent
Tang et al.

(10) Patent No.: US 10,459,556 B2
(45) Date of Patent: Oct. 29, 2019

(54) TOUCH DISPLAY PANE AND DISPLAY DEVICE

(71) Applicant: Wuhan China Star Optoelectronics Technology Co., Ltd., Wuhan, Hubei (CN)

(72) Inventors: Yuejun Tang, Guangdong (CN); De-Jiun Li, Guangdong (CN); Wenqing Song, Guangdong (CN); Tsung-Ying Yang, Guangdong (CN); Mingfei Du, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 10 days.

(21) Appl. No.: 15/577,252

(22) PCT Filed: Aug. 17, 2017

(86) PCT No.: PCT/CN2017/097751
§ 371 (c)(1),
(2) Date: Nov. 27, 2017

(87) PCT Pub. No.: WO2019/015001
PCT Pub. Date: Jan. 24, 2019

(65) Prior Publication Data
US 2019/0025967 A1 Jan. 24, 2019

(30) Foreign Application Priority Data
Jul. 20, 2017 (CN) .............................. 2017 1 059653

(51) Int. Cl.
*G06F 3/041* (2006.01)
*G06F 1/16* (2006.01)
(Continued)

(52) U.S. Cl.
CPC .......... *G06F 3/0412* (2013.01); *G06F 1/1626* (2013.01); *G06F 1/1637* (2013.01);
(Continued)

(58) Field of Classification Search
CPC ...... G06F 3/0412; G06F 1/1643; G06F 3/044; G02F 1/13338; H01L 23/488; H01L 24/26
See application file for complete search history.

(56) References Cited

U.S. PATENT DOCUMENTS

2005/0099402 A1  5/2005  Nakanishi et al.
2010/0110023 A1*  5/2010  Chien ..................... G02B 5/201
345/173
(Continued)

FOREIGN PATENT DOCUMENTS

CN  104536610 A  4/2015
CN  105739201 A  7/2016
(Continued)

*Primary Examiner* — Premal R Patel
(74) *Attorney, Agent, or Firm* — Andrew C. Cheng

(57) ABSTRACT

A touch display panel and a display device are disclosed. The touch display panel includes a first substrate, a second substrate, a first solder pad, a second solder pad and a touch sensing layer. The first substrate is defined with a display region and a non-display region. In the present invention, the first solder pad is disposed at a substrate having the touch sensing layer. That is, the first substrate is provided with a non-display region having the second solder pad. A wider black masking region for the first solder pad and corresponding trace region is not required so that an edge frame of the display device can be reduced, which is beneficial for a narrow-frame design of the display device.

14 Claims, 2 Drawing Sheets

(51) Int. Cl.
*H01L 23/488* (2006.01)
*H01L 23/00* (2006.01)
*G02F 1/1333* (2006.01)
*G06F 3/044* (2006.01)

(52) U.S. Cl.
CPC .......... *G06F 1/1643* (2013.01); *H01L 23/488* (2013.01); *H01L 24/26* (2013.01); *G02F 1/13338* (2013.01); *G06F 3/044* (2013.01)

(56) References Cited

U.S. PATENT DOCUMENTS

| | | |
|---|---|---|
| 2012/0206396 A1 | 8/2012 | Kitabayashi |
| 2012/0235948 A1 | 9/2012 | Inoue et al. |
| 2013/0044074 A1* | 2/2013 | Park .................... G02F 1/13338 345/174 |
| 2014/0009400 A1* | 1/2014 | Poorter .................. G06F 3/041 345/173 |
| 2015/0185942 A1* | 7/2015 | Kim ..................... G06F 3/0412 345/173 |
| 2015/0242041 A1* | 8/2015 | Sugita ................... G06F 3/044 345/174 |
| 2016/0018927 A1 | 1/2016 | Ding et al. |

FOREIGN PATENT DOCUMENTS

| | | |
|---|---|---|
| CN | 106530991 A | 3/2017 |
| CN | 206224423 U | 6/2017 |
| CN | 103927043 A | 7/2017 |

\* cited by examiner

TOUCH DISPLAY PANE AND DISPLAY DEVICE

BACKGROUND OF THE INVENTION

1. Field of the Invention

The present invention relates to a display technology, and more particularly to a touch display panel and a display device.

2. Description of Related Art

Currently, a display panel using a touch technology has been widely applied in various electronic products such as mobile phones, computers, personal digital assistants, smartphones, and tablet PCs.

Generally, the display panel includes an upper substrate (that is a CF substrate, color filter substrate), a lower substrate (that is a TFT substrate, Thin Film Transistor substrate), a display medium layer located between the CF substrate and the TFT substrate. Wherein, the display medium layer generally includes an alignment layer, a liquid crystal layer, etc. for helping displaying.

The directional terms mentioned in the present invention such as "top", "bottom", "left", "right", "inside", "outside", only represent direction relationships. For the figures of the present specification, the specific direction depends on a position relative to an observer. A location close to the observer is called "top" or "outside". A location away from the observer is called "bottom" or "inside". The other direction relationships in the figures of the present specification are also based on the definition described above.

With reference to FIG. 1, and FIG. 1 is a schematic diagram of on-cell touch display panel 100 according to the conventional art. In FIG. 1, a display region 10, an upper edge frame 11 of a non-display region, a right edge frame 12 of the non-display region, a left edge frame 13 of the non-display region and lower edge frame 14 of the non-display region of an electronic product are shown.

As shown in FIG. 2, FIG. 2 shows a schematic diagram of II-II cross section of the display panel 100. In order to help for understanding, FIG. 2 only shows a main structure of the display panel 100. The touch sensing layer 22 is disposed on an outer surface of a color filter substrate 21, that is, a side for viewing by eyes. A side of the outer surface of the color filter substrate 21 is provided with a first solder pad 23. An inner side of a TFT substrate 24 is provided with a second solder pad 26, and the second solder pad 24 is connected with a flexible circuit board and/or an integrated circuit for inputting various display signals such as an image data signal, a driving control signal, and a timing signal. The first solder pad 23 is connected with a flexible circuit board and/or a touch control chip for receiving and processing touch signals. FIG. 2 also shows a black masking layer 27, a display medium layer 25. The definition of the numeral not described in FIG. 2 is the same as FIG. 1.

The non-display region and the thin-film transistors (TFT) of pixels require to be shielded by the black masking layer. The inventors of the present application found that in the conventional on-cell touch technology, an array substrate including TFT and solder pads used as a lower substrate, the first solder pad located at the outer side of the upper substrate and electrically connected to the touch sensing layer and a corresponding trace region have to dispose a wider black masking layer for shielding so that the lower edge frame of an electronic product adopting the touch panel structure is wider.

SUMMARY OF THE INVENTION

The present invention provides a touch display panel and a display device for solving a problem that a development of a narrow-frame design is blocked by conventional display panel structure.

A first aspect of the embodiment of the present invention provides a touch display panel, and the touch display panel, comprises: a first substrate defined with a display region and a non-display region; a second substrate disposed opposite to the first substrate, wherein the first substrate is an upper substrate relative to the second substrate, and the second substrate is a lower substrate relative to the first substrate; a first solder pad; a second solder pad; a touch sensing layer disposed on a side of the first substrate away from the second substrate; wherein, the first solder pad and the second solder pad are disposed at the non-display region of the first substrate, the first solder pad is connected to the touch control circuit, and the second solder pad is connected to a display driving circuit; and wherein, the first solder pad and the second solder pad are disposed at a solder region of the first substrate that is in parallel with the non-display region and next to a boundary of the display region, a width of the solder region measured closest to the boundary and farthest away from the boundary is less than a sum of a width of the first solder pad and a width of the second solder pad.

A second aspect of the embodiment of the present invention provides a touch display panel, and the touch display panel, comprises: a first substrate defined with a display region and a non-display region; a second substrate disposed opposite to the first substrate, wherein the first substrate is an upper substrate relative to the second substrate, and the second substrate is a lower substrate relative to the first substrate; a first solder pad; a second solder pad; a touch sensing layer disposed on a side of the first substrate away from the second substrate; wherein, the first solder pad and the second solder pad are disposed at the non-display region of the first substrate, the first solder pad is connected to the touch control circuit, and the second solder pad is connected to a display driving circuit.

A third aspect of the embodiment of the present invention provides a display device, and the display device comprises: a touch display panel, comprising: a first substrate defined with a display region and a non-display region; a second substrate disposed opposite to the first substrate, wherein the first substrate is an upper substrate relative to the second substrate, and the second substrate is a lower substrate relative to the first substrate; a first solder pad; a second solder pad; a touch sensing layer disposed on a side of the first substrate away from the second substrate; wherein, the first solder pad and the second solder pad are disposed at the non-display region of the first substrate, the first solder pad is connected to the touch control circuit, and the second solder pad is connected to a display driving circuit.

The beneficial effect existed by comparing the technology provided by the present invention and the conventional art is: the present invention disposes the first solder pad of the touch display panel at the non-display region of the first substrate provided with the second solder pad, the touch sensing layer on a side of the first substrate away from the second substrate. That is, the first solder pad is disposed on a non-display region of the upper substrate provided with the second solder pad. Accordingly, a wider black masking region for the first solder pad 33 and corresponding trace region as the conventional art is not required so that an edge frame of the display device can be reduced, which is beneficial for a narrow-frame design of the display device.

DETAILED DESCRIPTION OF THE PREFERRED EMBODIMENT

In order to make the purpose, technology solution and features to be clearer, the following will combine figures and embodiments to describe the present invention in detail.

The following description is for the purpose of illustration not for limitation, and specific details are proposed such as the system configuration, the interface, and the technique in order to completely understand the present application. However, the person of ordinary skill in the art should know, in other embodiments without these specific details can also achieve the present application. In other instances, well-known devices, circuits and methods are omitted to prevent the unnecessary details hindering the description of the present application.

In order to effectively solve a problem that a narrow-frame design is blocked by conventional display panel structure. An embodiment of the present invention provides a touch display panel, and the touch display panel, comprises: a first substrate defined with a display region and a non-display region; a second substrate disposed opposite to the first substrate, wherein the first substrate is an upper substrate relative to the second substrate, and the second substrate is a lower substrate relative to the first substrate; a first solder pad; a second solder pad; a touch sensing layer disposed on a side of the first substrate away from the second substrate; wherein, the first solder pad and the second solder pad are disposed at the non-display region of the first substrate, the first solder pad is connected to the touch control circuit, and the second solder pad is connected to a display driving circuit. The following will describe the present invention through exemplary text and figures.

Figure 1:
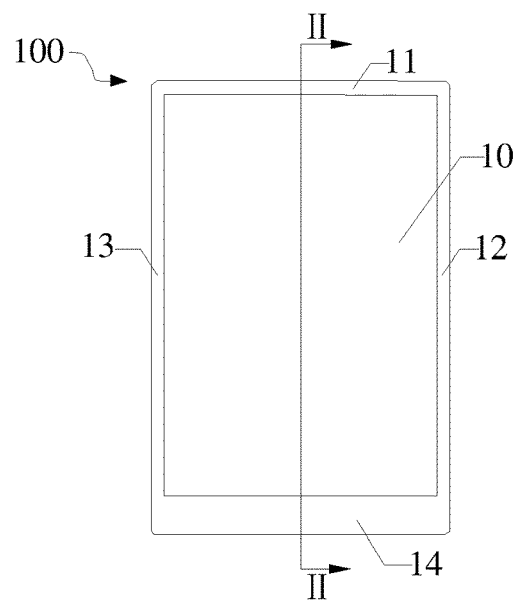
FIG. 1 is a schematic diagram of an on-cell touch display panel according to the conventional art.
Figure 2:
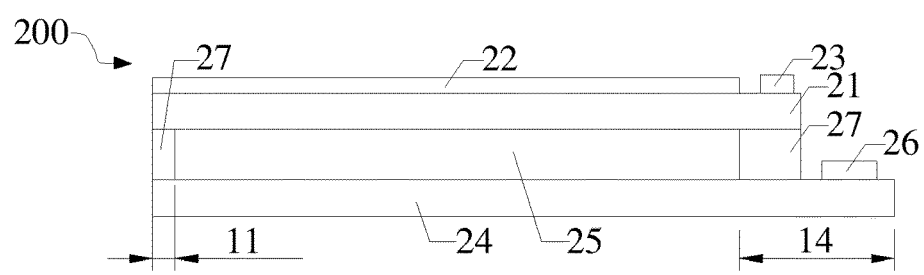
FIG. 2 is a schematic diagram of II-II cross section of the display panel according to the conventional art.
Figure 3:
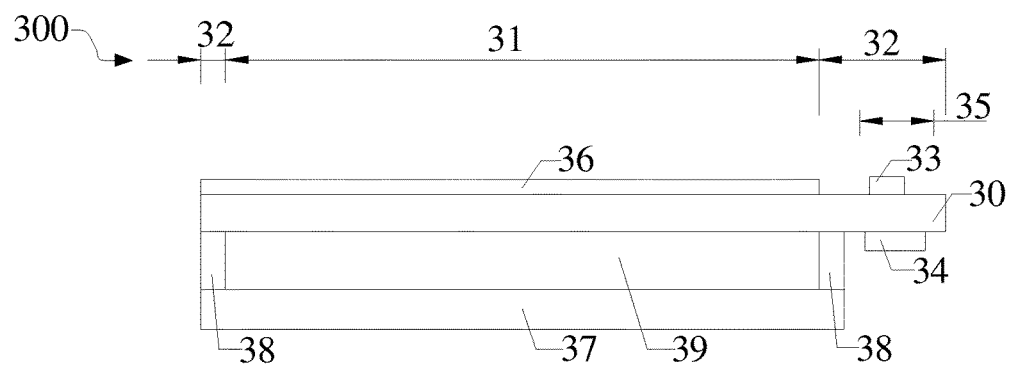
FIG. 3 is a schematic diagram of a cross-sectional view of a touch display panel according to an embodiment of the present invention.

With reference to FIG. 3, and FIG. 3 is a cross-sectional view of a touch display panel 300 according to an embodiment of the present invention. The cross section in FIG. 3 is the same or similar to the location of the cross section in FIG. 2. In order to help for illustrating, FIG. 3 only shows a portion of elements relative to the embodiment of the present invention. As shown in FIG. 3, the touch display panel 300 includes: a first substrate 30, a second substrate 37, a first solder pad 33, a second solder pad 34 and a touch sensing layer 36. The first substrate 30 defines a display region 31 and a non-display region 32. The first substrate 30 and the second substrate 37 are disposed oppositely. The first substrate 30 is an upper substrate with comparing to the second substrate 37. The second substrate 37 is a lower substrate with comparing to the first substrate 30. The first solder pad 33 and the second solder pad 34 are located at a non-display region 32 of the first substrate 30. The first solder pad 33 is connected to the touch control circuit, and the second solder pad 34 is connected to a display driving circuit. The touch sensing layer 36 is disposed at a side of the first substrate 30 away from the second substrate 37. FIG. 3 shows that the first solder pad 33 and the second solder pad 34 are located at a right thermal of the first substrate 30. Of course, the first solder pad 33 and the second solder pad 34 can be located at a left terminal of the first substrate 30. FIG. 3 is only exemplary.

Comparing the non-display region 14 that includes the first solder pad 23 and the second solder pad 26 in FIG. 2 with the non-display region 32 that includes the first solder pad 33 and the second solder pad 34 in FIG. 3, the touch display panel provided by the embodiment of the present invention is easier to form a narrow-frame design comparing to the conventional art.

As described above, disposing the first solder pad 33 of the touch display panel 300 at the non-display region 32 of the first substrate 30 provided with the second solder pad 34, in a normal situation, the second solder pad 34 is greater than the first solder pad 33. That is, using the non-transparent region of the second solder pad 34 or a black masking region of a backlight to shield the first solder pad 33 together, a wider black masking region for the first solder pad 33 and corresponding trace region is not required so that an edge frame of the display device can be reduced, which is beneficial for a narrow-frame design of the display device.

Optionally, the first solder pad 33 and the second solder pad 34 are disposed oppositely at two sides of the non-display region 32 of the first substrate 30.

For example, the first solder pad 33 and the second solder pad 34 are disposed oppositely at two sides of the non-display region 32 of the first substrate 30, which is convenient for an arrangement of traces connected with the first solder pad 33 and the second solder pad 34.

Optionally, the first solder pad 33 and the second solder pad 34 are disposed at a solder region of the first substrate 30 that is in parallel with the non-display region 32 and next to a boundary of the display region 31. A width of the solder region measured closest to the boundary and farthest away from the boundary is less than a sum of a width of the first solder pad 33 and a width of the second solder pad 34.

For example, in FIG. 3, the first solder pad 33 and the second solder pad 34 are disposed at a solder region of the first substrate 30 that is in parallel with the non-display region 32 and next to a boundary of the display region 31, a width of the solder region measured closest to the boundary and farthest away from the boundary is the width shown by numeral 35 in FIG. 3, and the width is less than a sum of a width of the first solder pad 33 and a width of the second solder pad 34. I should be noted that the widths of the first solder pad 33 and the second solder pad 34 are distances of locations of the first solder pad 33 and the second solder pad 34 adhering to the first substrate 30. Accordingly, a width of an edge frame of the display device can be reduced, which is beneficial to a narrow-frame design of the display device.

Actually, the width of the solder region measured closest to the boundary and farthest away from the boundary less than a sum of a width of the first solder pad 33 and a width of the second solder pad 34 means that the width of the solder region measured closest to the boundary and farthest away from the boundary is decided by the width of the second solder pad 34 in a great degree. Disposing the first solder pad 33 at the non-display region 32 of the first substrate 30 provided with the second solder pad 34 will not make the width of the solder region measured closest to the boundary and farthest away from the boundary to be increased. In a normal situation, the width of the second solder pad 34 is greater than a width of the first solder pad 33, the width 35 of the solder region measured closest to the boundary and farthest away from the boundary is decided by the width of the second solder pad 34.

Optionally, the first solder pad 33 and the second solder pad 34 includes a group of lead pins (not shown), a projection of the lead pins of the first solder pad 33 on the first substrate is overlapped with a projection of the lead pins of the second pad 34 on the first substrate.

Optionally, a projection of the lead pins of the first solder pad 33 on the first substrate 30 overlapped with a projection of the lead pins of the second pad 34 on the first substrate 30 specifically is: contour of an orthographic projection of the lead pins of the first solder pad 33 on the first substrate and corresponding to a location of a surface of the first substrate 30 providing with the second solder pad 34 falls into a region formed by an orthographic projection of the lead pins of the second pad 34 on the first substrate 30. Accordingly, a width of an edge frame of the display device can be reduced, which is beneficial to a narrow-frame design of the display device.

Optionally, an orthographic projection of the lead pins of the first solder pad 33 on the first substrate 30 is an orthographic projection of each lead pin of the first solder pad 33, and an orthographic projection of the lead pins of the second solder pad 34 on the first substrate 30 is an orthographic projection of each lead pin of the second solder pad 34.

Optionally, the touch sensing layer 36 can include a transmitting electrode, a receiving electrode and an insulation layer disposed between the two electrodes. The transmitting electrode and the receiving electrode can be disposed at a same layer or different layers. A material of each of the transmitting electrode and t receiving electrode can be indium tin oxide, but not limited.

Optionally, between the second substrate 37 and the first substrate 30, a black masking layer or a plastic frame 38 is provided.

Optionally, the second substrate 37 is right opposite to a portion of the first substrate 30, and a display media layer 39 is formed between the second substrate 37 and the first substrate 30.

Optionally, the display media layer 39 can include a liquid crystal layer and an alignment layer.

Optionally, the black masking layer or the plastic frame 38 is disposed surrounding the display media layer 39, and the black masking layer or the plastic frame 38 is disposed at an edge of a side of the second substrate 37 opposite to the first substrate 30.

Optionally, the first substrate 30 is a thin-film transistor substrate and the second substrate 37 is a color filter substrate.

Optionally, the first substrate 30 is a COA substrate (Color Filter On Array substrate, that is, a substrate that directly disposing a color resist layer on the array substrate), a side of the second substrate 37 closed to the first substrate 30 is covered with a buffering layer.

Optionally, the first substrate 30 is a COA substrate, a color resist layer is disposed on the first substrate 30, and the second substrate 37 is a glass substrate or a plastic substrate. In order prevent the impurities of the second substrate 37 from entering the display media layer 39, a side of the second substrate 37 close to the first substrate 30 is covered with a buffering layer such that the impurities of the second substrate 37 cannot enter the display media layer 39.

Comparing to the conventional art to dispose the array substrate as a lower substrate, the embodiment of the present invention dispose the touch sensing layer 36 to a side of the first substrate 30 away from the second substrate 37. For convenient for an electric connection between the touch sensing electrode layer 36 and the first solder pad 33, disposing the first substrate 30 (a thin-film transistor substrate or a COA substrate), that is the array substrate as the upper substrate.

It should be understood that, the above description only illustrate two kinds of the first substrate 30 and a corresponding second substrate 37, but the present invention is not limited.

Optionally, the touch display panel 300 can be a panel that adopts a FFS (Fringe Field Switching) display mode.

Optionally, the touch display panel 300 can be an on-cell touch display panel. That is a display panel which embedding a touch function layer between an upper substrate of the touch display panel and a polarizer.

Optionally, the touch display panel 300 is a transmissive liquid crystal display panel, and a thin-film transistor of the first substrate 30 is a top-gate type thin-film transistor.

Optionally, the touch display panel 300 is a reflective liquid crystal display panel or a transflective liquid crystal display panel, a thin-film transistor of the first substrate 30 is a top-gate type thin-film transistor or a bottom-gate type thin-film transistor.

Optionally, in the embodiment of the present invention, the touch display panel 300 is a LTPS (Low Temperature Poly-silicon) display panel.

Figure 4:
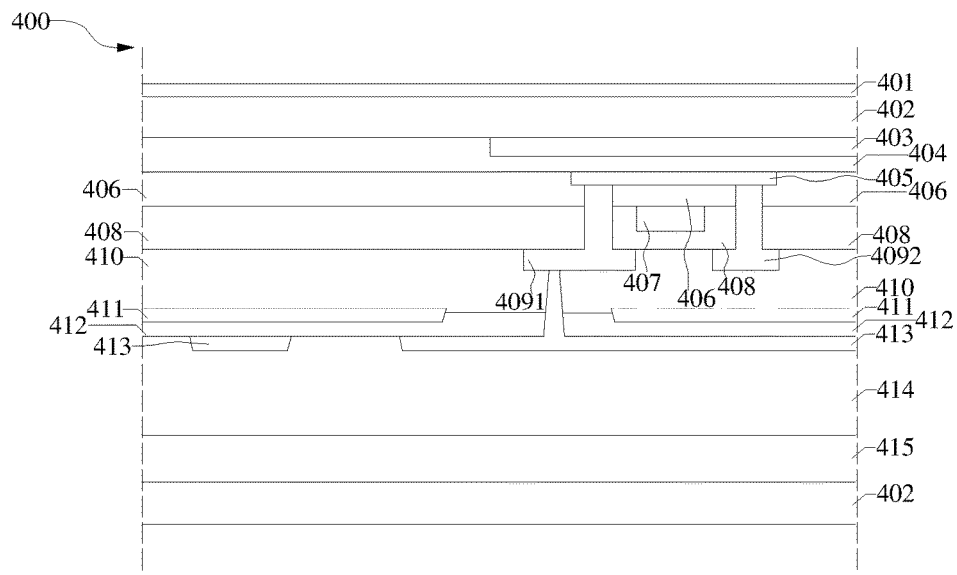
FIG. 4 is detail diagram of a partial cross-sectional view of a LTPS display panel according to an embodiment of the present invention.

With reference to FIG. 4, and FIG. 4 is detail diagram of a partial cross-sectional view of a LTPS display panel 400 according to an embodiment of the present invention. The LTPS display panel shown in FIG. 4 is a transmissive liquid crystal display panel. A base layer 402 in FIG. 4 is cover with a touch sensing layer 401. In a direction from the base layer 402 of the substrate to a display media layer 414, a black masking layer 403, a buffering layer or a planarization layer 404, a semiconductor active layer 405, a gate insulation layer 406, a gate electrode 407, an insulation layer 408, a drain electrode 4091m a source electrode 4092, a planarization layer 410, a common electrode 411, an insulation layer 412, a pixel electrode 413 are sequentially provided. In a direction from a base layer 402 of a lower substrate to the display media layer 414, a color resist layer 415 is provided. The semiconductor active layer 405 is sensitive to the light. At this time, the thin-film transistor (including the gate electrode 407, the drain electrode 4091 and the source electrode 4092) is a top-gate type thin-film transistor. Using the gate electrode 407, the drain electrode 4091 and the source electrode 4092, a light emitted from a backlight system (not shown) outside the lower substrate can be blocked so as to provide a protection to the semiconductor active layer 405.

Figure 5:
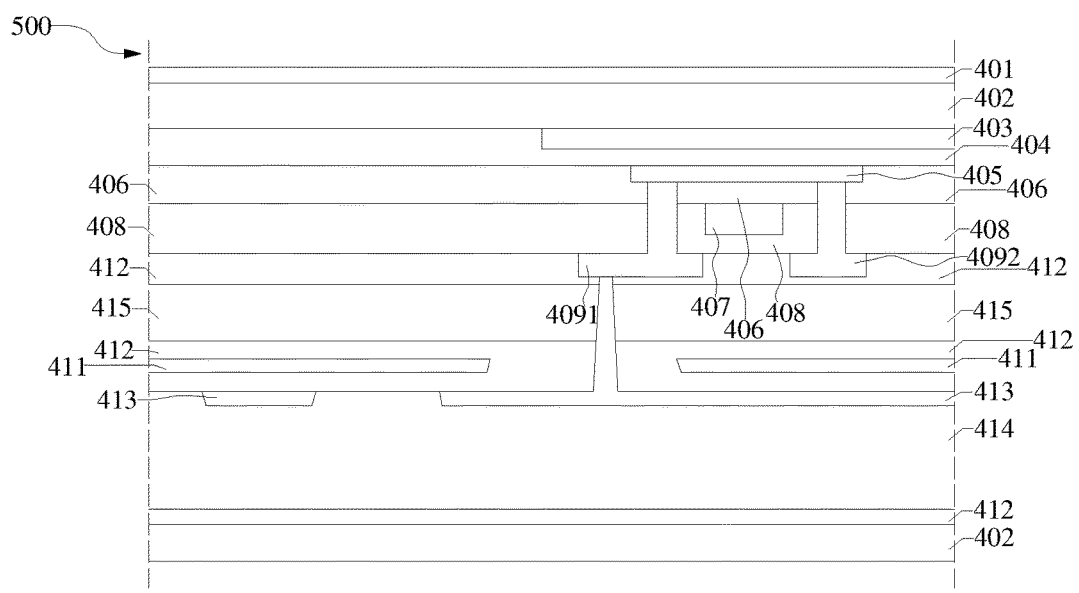
FIG. 5 is detail diagram of a partial cross-sectional view of another LTPS display panel according to an embodiment of the present invention.

With reference to FIG. 5, and FIG. 5 is detail diagram of a partial cross-sectional view of another LTPS display panel 500 according to an embodiment of the present invention. The difference between FIG. 5 and FIG. 4 is: disposing the color resist layer 415 on the upper substrate to form a COA substrate. In a direction from the base layer 402 of the lower substrate to the display medium layer 414, an insulation layer 412 is provided. The thin-film transistor (including the gate electrode 407, the drain electrode 4091 and the source electrode 4092) of the upper substrate is a top-gate type thin-film transistor. Using the gate electrode 407, the drain electrode 4091 and the source electrode 4092, a light emitted from a backlight system (not shown) outside the lower substrate can be blocked so as to provide a protection to the semiconductor active layer 405. The meaning of the numerals not described in FIG. 5 is the same as FIG. 4.

The LTPS display panels 400 and 500 in FIG. 4 and FIG. 5 can be a FFS (Fringe Field Switching) liquid crystal display mode.

Optionally, a material of the semiconductor active layer 405 is indium gallium zinc oxide, amorphous silicon or low temperature polysilicon.

Optionally, the display mode of the touch display panel 300 can be a FFS (Fringe Field Switching) liquid crystal display mode, a twisted nematic liquid crystal display mode or a vertical arrangement liquid crystal display mode.

The present invention disposes the first solder pad 33 of the touch display panel 300 at the non-display region 32 of the first substrate 30 provided with the second solder pad 34, in a normal situation, the second solder pad 34 is greater than the first solder pad 33. That is, using the non-transparent region of the second solder pad 34 or a black masking region of a backlight to shield the first solder pad 33 together, a wider black masking region for the first solder pad 33 and corresponding trace region is not required so that an edge frame of the display device can be reduced, which is beneficial for a narrow-frame design of the display device.

In order to solve a problem that a narrow-frame design is blocked by conventional display panel structure of the conventional display panel, another embodiment of the present invention provides a display device, and the display device includes a touch display panel, comprising: a first substrate defined with a display region and a non-display region; a second substrate disposed opposite to the first substrate, wherein the first substrate is an upper substrate relative to the second substrate, and the second substrate is a lower substrate relative to the first substrate; a first solder pad; a second solder pad; a touch sensing layer disposed on a side of the first substrate away from the second substrate; wherein, the first solder pad and the second solder pad are disposed at the non-display region of the first substrate, the first solder pad is connected to the touch control circuit, and the second solder pad is connected to a display driving circuit.

Optionally, the display device further includes a first printed circuit board and a second printed circuit board, the first solder pad is electrically connected to the first printed circuit board, the first printed circuit board includes a touch control chip. The second solder pad is electrically connected to the second printed circuit board, the second printed circuit board includes a display signal driving system. The display device may further include a third circuit board, and the first solder pad and the second solder pad are connected to the third printed circuit board. Third printed circuit board includes a touch control chip and the display signal driving system. Optionally, the display device further includes a backlight system, a polarizer, etc.

Optionally, the display device is an embedded display device.

Optionally, the display device is smartphone, panel computer, etc.

The explanation of the corresponding elements and definition of the sentences of the aforementioned embodiments can apply to the present embodiment, no more repeating.

It should be noted that another display device is based on a same ideas as the display device that can develop a narrow-frame device. The technology effect is the same as the embodiments of the present invention, no more repeating.

It should be noted that the terms "first", "second" in the embodiments of the present invention such as a first substrate and a second substrate only for convenient for expression and indicating, which does not mean that the specific embodiment of the present invention has corresponding first substrate and second substrate.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A touch display panel, comprising:
   a first substrate defined with a display region and a non-display region;
   a second substrate disposed opposite to the first substrate, wherein the first substrate is an upper substrate relative to the second substrate, and the second substrate is a lower substrate relative to the first substrate;
   a first solder pad;
   a second solder pad; and
   a touch sensing layer disposed on a side of the first substrate away from the second substrate;
   wherein, the first solder pad and the second solder pad are disposed at the non-display region of the first substrate, the first solder pad is connected to a touch control circuit, and the second solder pad is connected to a display driving circuit; and
   wherein, the first solder pad and the second solder pad are disposed at a solder region of the first substrate that is in parallel with the non-display region and next to a boundary of the display region, a width of the solder region measured closest to the boundary and farthest away from the boundary is less than a sum of a width of the first solder pad and a width of the second solder pad;
   wherein the first solder pad and the second solder pad are disposed on the first substrate;
   wherein, the first solder pad and the second solder pad are disposed oppositely at two sides of the non-display region of the first substrate;
   wherein, the first substrate comprises:
   a black masking layer;
   a semiconductor active layer;
   a gate electrode;
   a drain electrode; and
   a source electrode;
   wherein the gate electrode, the drain electrode and the source electrode are covered by the semiconductor active layer;
   wherein the semiconductor active layer is fully covered by the black masking layer;
   wherein a projected area of the semiconductor active layer is less than a total projected area of the gate electrode, the drain electrode and the source electrode.

2. The touch display panel according to claim 1, wherein, the first substrate is a thin-film transistor substrate, the second substrate is a color filter substrate; or the first substrate is a Color Filter On Array (COA) substrate, and a side of the second substrate close to the first substrate is covered with a buffering layer.

3. The touch display panel according to claim 1, wherein, the touch display panel is a transmissive liquid crystal display panel, and a thin-film transistor of the first substrate is a top-gate type thin-film transistor; or the touch display panel is a reflective liquid crystal display panel or a transflective liquid crystal display panel, a thin-film transistor of the first substrate is a top-gate type thin-film transistor or a bottom-gate type thin-film transistor.

4. A touch display panel, comprising:
a first substrate defined with a display region and a non-display region;
a second substrate disposed opposite to the first substrate, wherein the first substrate is an upper substrate relative to the second substrate, and the second substrate is a power substrate relative to the first substrate;
a first solder pad;
a second solder pad; and
a touch sensing layer disposed on a side of the first substrate away from the second substrate;
wherein, the first solder pad and the second solder pad are disposed at the non-display region of the first substrate, the first solder pad is connected to a touch control circuit, and the second solder pad is connected to a display driving circuit;
wherein the first solder pad and the second solder pad are disposed on the first substrate;
wherein, the first solder pad and the second solder pad are disposed oppositely at two sides of the non-display region of the first substrate;
wherein, the first substrate comprises:
a black masking layer;
a semiconductor active layer;
a gate electrode;
a drain electrode; and
a source electrode;
wherein the gate electrode, the drain electrode and the source electrode are covered by the semiconductor active layer;
wherein the semiconductor active layer is fully covered by the black masking layer; wherein a projected area of the semiconductor active layer is less than a total projected area of the gate electrode, the drain electrode and the source electrode.

5. The touch display panel according to claim 4, wherein, the first substrate is a thin-film transistor substrate, the second substrate is a color filter substrate; or the first substrate is a Color Filter On Array (COA) substrate, and a side of the second substrate close to the first substrate is covered with a buffering layer.

6. The touch display panel according to claim 4, wherein, the first substrate is a thin-film transistor substrate, the second substrate is a color filter substrate; or the first substrate is a Color Filter On Array (COA) substrate, and a side of the second substrate close to the first substrate is covered with a buffering layer.

7. The touch display panel according to claim 4, wherein, the touch display panel is a panel that adopts a Fringe Field Switching (FFS) display mode.

8. The touch display panel according to claim 4, wherein, the touch display panel is an on-cell touch display panel.

9. The touch display panel according to claim 4, wherein, the touch display panel is a transmissive liquid crystal display panel, and a thin-film transistor of the first substrate is a top-gate type thin-film transistor; or the touch display panel is a reflective liquid crystal display panel or a transflective liquid crystal display panel, a thin-film transistor of the first substrate is a top-gate type thin-film transistor or a bottom-gate type thin-film transistor.

10. A display device, comprising:
a touch display panel, comprising:
a first substrate defined with a display region and a non-display region;
a second substrate disposed opposite to the first substrate, wherein the first substrate is an upper substrate relative to the second substrate, and the second substrate is a lower substrate relative to the first substrate;
a first solder pad;
a second solder pad; and
a touch sensing layer disposed on a side of the first substrate away from the second substrate;
wherein, the first solder pad and the second solder pad are disposed at the non-display region of the first substrate, the first solder pad is connected to a touch control circuit, and the second solder pad is connected to a display driving circuit;
wherein the first solder pad and the second solder pad are disposed on the first substrate;
wherein, the first solder pad and the second solder pad are disposed oppositely at two skies of the non-display region of the first substrate;
wherein, the first substrate comprises:
a black masking layer;
a semiconductor active layer;
a gate electrode;
a drain electrode; and
a source electrode;
wherein the gate electrode, the drain electrode and the source electrode are covered by the semiconductor active layer;
wherein the semiconductor active layer is fully covered by the black masking layer; wherein a projected area of the semiconductor active layer is less than a total projected area of the gate electrode, the drain electrode and the source electrode.

11. The display device according to claim 10, wherein, the first solder pad and the second solder pad are disposed at a solder region of the first substrate that is in parallel with the non-display region and next to a boundary of the display region, a width of the solder region measured closest to the boundary and farthest away from the boundary is less than a sum of a width of the first solder pad and a width of the second solder pad.

12. The display device according to claim 10, wherein, the first substrate is a thin-film transistor substrate, the second substrate is a color filter substrate; or the first substrate is a Color Filter On Array (COA) substrate, and a side of the second substrate close to the first substrate is covered with a buffering layer.

13. The display device according to claim 10, wherein, the touch display panel is a panel that adopts a Fringe Field Switching (FFS) display mode.

14. The display device according to claim 10, wherein, the touch display panel is a transmissive liquid crystal display panel, and a thin-film transistor of the first substrate is a top-gate type thin-film transistor; or
the touch display panel is a reflective liquid crystal display panel or a transflective liquid crystal display panel, a thin-film transistor of the first substrate is a top-gate type thin-film transistor or a bottom-gate type thin-film transistor.

* * * * *